United States Patent [19]

Steele

[11] Patent Number: 5,111,079
[45] Date of Patent: May 5, 1992

[54] POWER REDUCTION CIRCUIT FOR PROGRAMMABLE LOGIC DEVICE

[75] Inventor: Randy C. Steele, Southlake, Tex.

[73] Assignee: SGS-Thomson Microelectronics, Inc., Carrollton, Tex.

[21] Appl. No.: 545,921

[22] Filed: Jun. 29, 1990

[51] Int. Cl.⁵ .......................................... H03K 19/177
[52] U.S. Cl. ................................... 307/465; 307/494; 307/296.3; 365/189.08
[58] Field of Search ............... 307/443, 465, 471, 494, 307/246.3; 365/227, 189.08

[56]  References Cited

U.S. PATENT DOCUMENTS

| | | | |
|---|---|---|---|
| 4,761,570 | 8/1988 | Williams | 307/465 |
| 4,906,862 | 3/1990 | Itano et al. | 307/296.3 |
| 4,940,909 | 7/1990 | Mulder et al. | 307/465 |
| 4,963,769 | 10/1990 | Hiltpold et al. | 307/296.3 X |
| 4,992,679 | 2/1991 | Takata et al. | 307/465 |
| 5,012,135 | 4/1991 | Kaplinsky | 307/465 |

*Primary Examiner*—David Hudspeth
*Attorney, Agent, or Firm*—Richard K. Robinson; Lisa K. Jorgenson; Kenneth C. Hill

[57]  ABSTRACT

According to the present invention, during programming of a programmable logic device, programming information corresponding to an input signal is loaded into a shift register. This input information is compared with programming information corresponding to a second, complementary input signal to determine if the two signals are used by the programmable logic device. If the two inputs are not used, a bit is stored in a memory cell indicating such nonuse. An input buffer is disabled when the bit in the memory cell indicates the complementary signals corresponding to that input buffer are not used.

17 Claims, 1 Drawing Sheet

POWER REDUCTION CIRCUIT FOR PROGRAMMABLE LOGIC DEVICE

CROSS-REFERENCE TO RELATED APPLICATIONS

The present application contains subject matter in common with copending U.S. Application Ser. No. 502,572, titled SRAM BASED CELL FOR PROGRAMMABLE LOGIC DEVICES, filed Mar. 30, 1990, which is assigned to the assignee hereof and which is incorporated by reference hereinto.

BACKGROUND OF THE INVENTION

1. Field of the Invention

The present invention relates generally to integrated circuit devices and more specifically to programmable logic devices which are configurable by a user.

2. Description of the Prior Art

Programmable logic devices are becoming increasingly popular in the electronics industry because of their flexibility. These devices allow a user to configure a standard part to perform a wide variety of standard logic functions. Since a single standard device can be configured many different ways, the total cost of using such a device in a system can be significantly less than the cost of custom design parts, especially when the product volume is not large. If changes or update are needed to the programmed logic function, some types of devices can be reprogrammed.

Typically, a logic function for a programmable logic device will not utilize all the input lines of the programmable logic device. These unutilized input lines are termed "don't care" inputs because they do not have an effect in the logic functions programmed in the programmable logic device.

As is known in the art, the components which define a logic device as well as the device itself consume power during operations of the device. The problem with the unutilized or "don't care" inputs is that the components corresponding to those inputs consume power during normal operation of the device, even though the inputs are not used in the programmed logic function. Consequently, the actual power needed by the programmable logic device to perform its logic function is unnecessarily increased by the components of the unutilized inputs.

Thus a need exists for a mechanism which shuts off power to the circuitry corresponding to an unused input, thus lowering the power consumed by a programmable logic device. Moreover, it is desirable that such a mechanism not adversely effect normal operation of the device.

SUMMARY OF THE INVENTION

It is therefore an object of the present invention to provide a method to determine if an input will be used in a logic device.

It is another object of the present invention to provide a method to disable an input buffer when an input will not be used in a logic device.

It is another object of the present invention to disable an input buffer without adversely affecting normal operation of the device.

Therefore, according to the present invention, during programming of a programmable logic device, programming information corresponding to an input signal is loaded into a shift register. This input information is compared with programming information corresponding to a second, complementary input signal to determine if the two signals are used by the programmable logic device. If the two inputs are not used, a bit is stored in a memory cell indicating such nonuse. An input buffer is disabled when the bit in the memory cell indicates the complementary signals corresponding to that input buffer are not used.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
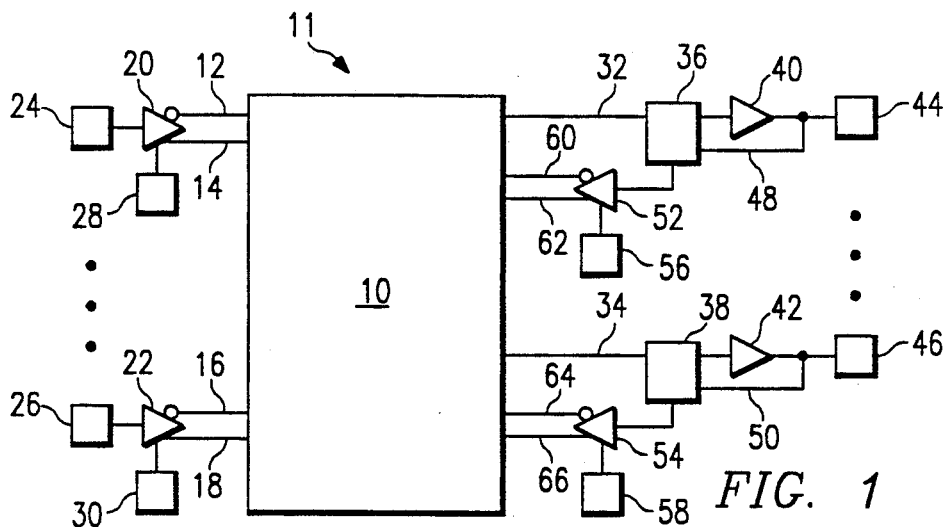
FIG. 1 is a simplified block diagram of a programmable logic device according to the invention.

Referring to FIG. 1 a portion of a programmable logic device 11 is shown. Input pads 24, 26 are connected to input buffer 20, 22 respectively. Each input buffer 20, 22 provides a true signal line 14, 18 and a complement signal line 12, 16. Only two input pads 24, 26 and input buffers 20, 22 are shown in FIG. 1, but an actual device typically has a much larger number.

Each of the signal lines 12-18 is connected to an AND/OR array 10. A user can configure the and/or array 10 to perform a particular logic function. When programmed, it is common to have input signal lines which are not utilized in the logic function. According to the present invention, memory cells 28, 30 are used to store a bit indicating use or nonuse of a signal line 14, 18 and its complement 12, 16. If a signal line 14, 18 and its complement 12, 16 will be used, the bit in the memory cell 28, 30 will enable the input buffer 20, 22. If however, the signal line 14, 18 and its complement 12, 16 will not be used in the logic function, the input buffer 20, 22 that corresponds to the unused lines will be disabled.

Output signal lines 32, 34 from the AND/OR array 10 are connected to output logic macrocells 36, 38. Output buffers 40, 42 are connected between the output logic macrocells 36, 38 and the output pads 44, 46.

Should a user require feedback or additional input lines, signal lines 48, 50 are connected to the output logic macrocells 36, 38. Once again, input buffers 52, 54 are connected to the output logic macrocells 36, 38 and generate signal lines 62, 66 and complements 60, 64 respectively. Memory cells 56, 58 store a bit which can enable or disable the input buffers 52, 54 based on the signal lines used in by programmed logic function.

Figure 2:
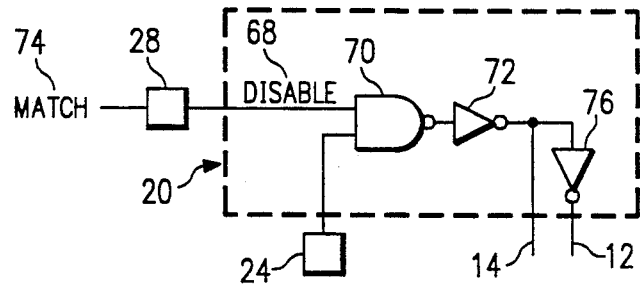
FIG. 2 is a block diagram of a logic circuit for disabling an input buffer according to the present invention.

FIG. 2 illustrates one implementation of the input buffer 20. A NAND gate 64 is connected to the memory cell 28 and input pad 24. When a signal line 14 and its complement 12 are not used by the programmed logic function, a bit MATCH 74 is generated and stored in the memory cell 28. The signal DISABLE is preferably taken from the complement output of cell 28, so that DISABLE is complementary to MATCH. The signal DISABLE 68 is set low thereby keeping the output of the NAND gate 70 high. An inverter 72 is connected to the NAND gate 70, and the output of the inverter 72 is signal line 14. To get the complement of signal line 14, an inverter 76 is connected to inverter 72, and a signal is generated on line 12 is generated.

Figure 3:
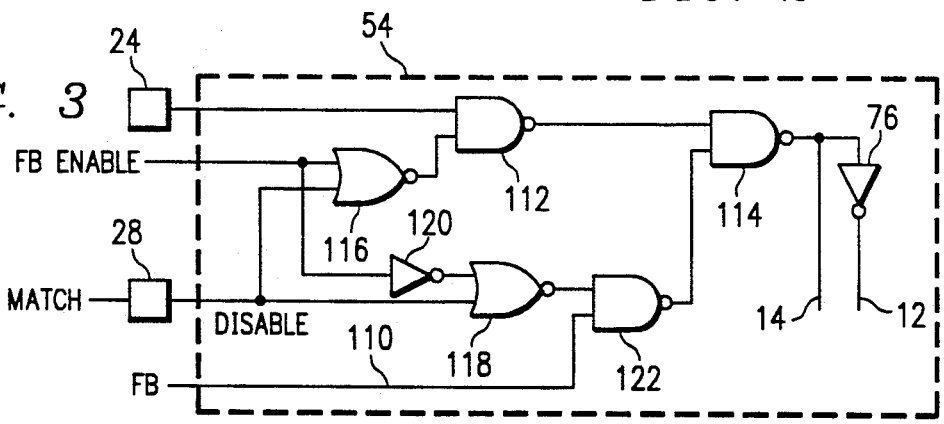
FIG. 3 is a block diagram of an alternative logic circuit for disabling an input buffer according to the present invention.

FIG. 3 shows an alternative input buffer 52 which can be used when either an input signal line 24 or a feedback line 110 is needed. Input line, or pad, 24 is connected to NAND gate 112, which in turn is connected to NAND gate 114. The DISABLE signal from storage element 28 is connected to NOR gates 116, 118. A signal FB Enable is connected to NOR gate 116 and inverter 120, which is in turn connected to NOR gate 118. The feedback signal on line 110 is connected to NAND gate 122, as is the output of NOR gate 118. NOR gate 116 is connected to NAND gate 112, and NAND gate 122 is connected to NAND gate 114.

For this buffer 54, DISABLE has the same value as MATCH. If DISABLE is high, both NOR gate outputs are held low, holding NAND gates 112 and 122 low, and the output of NAND gate 114 high. If DISABLE is high, either the signal on pad 24 or the FB signal is connected to the output of gate 114, depending on the value of FB Enable. Thus, DISABLE disables both input signals, or neither, depending on its value.

Figure 4:
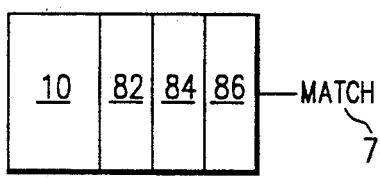
FIG. 4 is a simplified block diagram of comparison circuitry used to determine if an input and its complement are unutilized.

FIG. 4 depicts a simple block diagram of circuitry used for determining whether signal lines are used by the programmed logic function. Programming data is shifted into the serial shift register 82 as known in the art. A copy of the data is stored in the random access memory 84 while the data is programmed into the and-/or array 10. Then a second group of programming data is loaded into the shift register 82. The addresses of the two groups of programming data are compared to insure the two groups are complementary. Addressing of the programming data is known in the art. If the two groups are complements of each other, the comparison circuitry 86 compares each element of the first group of programming data with corresponding elements in the second group of programming data. If the two groups of data are identical, they are not needed by the programmed logic function and the bit MATCH 74 is set. The second group of programming data is then programmed into the AND/OR array 10. The value of MATCH is programmed into the enable/disable bit for the input buffer corresponding to the first and second groups at the time the second group is programmed into the array 10.

Figure 5:
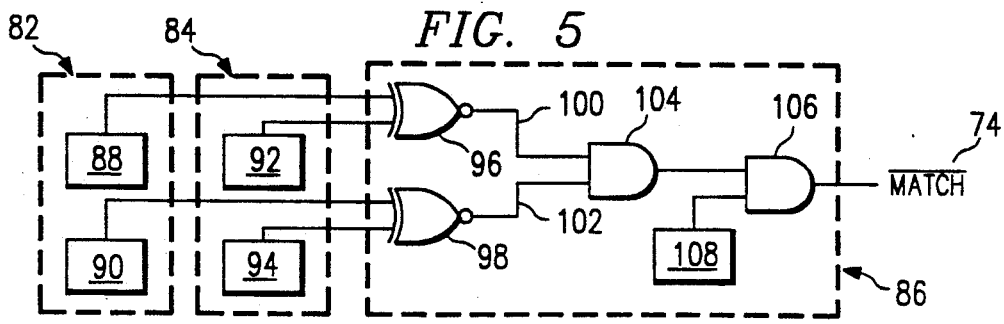
FIG. 5 is a block diagram of a logic circuit for determining if an input and its complement are unutilized.

FIG. 5 illustrates the shift register 82, the random access memory 84, and the comparison circuitry 86 in greater detail. Only two elements 88, 90 in the shift register and two elements 92, 94 in the random access memory are shown in FIG. 5, but an actual device typically has a much larger number.

Exclusive NOR gates 96, 98 in the comparison circuitry 86 are connected to elements 88, 90 in the shift register 82 and elements 92, 94 in the random access memory 84. If elements 88, 90 have the same values as elements 92, 94 respectively, the output 100, 102 of the exclusive NOR gates 96, 98 will be high. Outputs 100, 102 are connected to AND gate 104. When outputs 100, 102 are both high, indicating elements 88, 90 and elements 92, 94 match, the output of AND gate 104 is high. AND gate 106 is connected to AND gate 104 and an address comparator 108. If the address comparator 108 indicates elements 88, 90 are complementary to elements 92, 94, the signal MATCH 74 is generated indicating the two groups of programming data are not used in the programmed logic function. MATCH is inverted to generate the signal MATCH of FIGS. 2 and 3, and, is connected to the memory cell 28 corresponding to the input addressed by the groups of programming data currently found in the shift register 82 and the memory 84.

If any pair of the elements 88, 90 and elements 92, 94 have different values and thus do not match, the output 100, 102 of one or more of the exclusive NOR gates 96, 98 will be low. In this case, the signal MATCH 74 will remain low, indicating the two groups of programming data are needed in the programmed logic function. Alternatively, if the address comparator 108 indicates that the elements 88, 90 and elements 92, 94 are not complements of each other, the signal match will remain low.

If the AND/OR array 10 is constructed using EPROM or EEPROM technology, the memory cell 28 should be an EPROM or EEPROM component as well. Alternatively, if the AND/OR array 10 is an SRAM based device, the memory cell 28 should be SRAM also. If desired, the SRAM memory cell can have a battery back-up, so that when the device is turned off the data stored in the memory cell 10 will be saved. Co-pending application Ser. No. 502,572, which has been incorporated by reference, describes the design and operation of a preferred design for an SRAM based programmable logic device.

The invention is described in terms of an automatic method for determining whether an input signal is used, and then enabling or disabling an input buffer based on the use or non-use of its corresponding signal line. However, the enable/disable information could be programmed directly into the memory cell 28 when programming the programmable logic device 11. Furthermore, the invention is not limited to use with logic devices containing AND/OR arrays. This invention could be used with other types of logic devices.

While the invention has been particularly shown and described with reference to a preferred embodiment, it will be understood by those skilled in the art that various changes in form and detail may be made therein without departing from the spirit and scope of the invention.

What is claimed is:

1. A programmable logic device comprising:
    a plurality of inputs;
    a logic array, connected to said inputs, to define a logic function thereof;
    a storage element connected to each input for storing configuration information for selectively disabling its associated input;
    a plurality of outputs connected to said array;
    a programming buffer for holding programming data to program a portion of the device;
    a plurality of memory elements connected to said programming buffer for storing a copy of data input previously thereto;
    comparison circuitry connected to said programming buffer and said memory elements for generating a comparison signal indicative of a match between data in said buffer and data in said plurality of memory elements; and means for storing configuration information in said storage elements based upon the comparison signal.

2. The device of claim 1, wherein each storage element comprises a memory element which can be written to during programming of said device.

3. The device of claim 2, wherein each storage element comprises an SRAM.

4. The device of claim 2, wherein each storage element comprises programmable read only storage element.

5. The device of claim 1, wherein each input is connected to said array through an input buffer, and wherein the associated storage element is set to enable or disable the input buffer based on configuration information in said array.

6. The programmable logic device of claim 1, wherein said programming buffer comprises a serial shift register.

7. The programmable logic device of claim 1, wherein said memory elements store a copy of data input for a row which was programmed immediately prior to the current row.

8. A circuit block for use in programmable logic devices, comprising:

a programming buffer for holding programming data to program a portion of the device;

a plurality of storage elements connected to said programming buffer for storing a copy of data input previously thereto; and comparison circuitry connected to said programming buffer and said storage elements for generating a signal indicative of a match between data in said buffer and data in said plurality of storage elements.

9. The circuit block of claim 8, wherein said programming buffer comprises a serial shift register.

10. The circuit block of claim 8 wherein each storage element comprises random access memory which can be written to and read from during programming of said device.

11. The circuit block of claim 8, wherein said comparison circuitry comprises a combination of logic gates.

12. The circuit of claim 8, wherein said storage elements store a copy of data input for a row which was programmed immediately prior to the current row.

13. A circuit block for use in programmable logic devices, comprising:

a storage cell;

an input signal line; and an input buffer connected to said storage cell and said input signal line, wherein said input buffer is disabled if said storage cell has a first value, and is enabled if said storage cell has a second value, and wherein said input buffer comprises a NAND gate connected to said storage cell and said input signal line, a first inverter connected to the output of said NAND gate, and a second inverter connected to the output of said first inverter, wherein the outputs of the first and second inverters define true and complement outputs of said input buffer.

14. A circuit block for use in programmable logic devices, comprising:

a storage cell;

an input signal line; and an input buffer connected to said storage cell and said input signal line, wherein said input buffer is disabled if said storage cell has a first value, and is enabled if said storage cell has a second value, and wherein said input buffer allows optional selection of an input signal line or a feedback signal line to be output therefrom, wherein the value in said storage cell enables or disables both the input signal line and the feedback signal line.

15. A method for determining whether an input to a programmable logic device will be used in a logic function, comprising the steps of:

loading programming data for a row corresponding to the input into a programming buffer;

comparing the loaded data to data previously loaded corresponding to a different row which is complementary to the first row; and if the loaded data matches the row which is its complement, then generating a signal indicating that the input will not be used.

16. The method of claim 15, wherein said comparing step comprises comparing the loaded data to programming data used to program a row immediately prior to the loaded data row.

17. The method of claim 15, further comprising the step of:

if an input will not be used, disabling an input buffer associated with such input.

* * * * *